United States Patent
Fust et al.

(10) Patent No.: US 9,331,691 B2
(45) Date of Patent: May 3, 2016

(54) CONTROL UNIT, IN PARTICULAR FOR A VEHICLE COMPONENT

(75) Inventors: Winfried Fust, Lippstadt (DE); Frank Vogt, Lichtenau (DE)

(73) Assignee: BEHR-HELLA THERMOCONTROL GMBH, Stuttgart (DE)

( * ) Notice: Subject to any disclaimer, the term of this patent is extended or adjusted under 35 U.S.C. 154(b) by 271 days.

(21) Appl. No.: 13/991,196

(22) PCT Filed: Nov. 29, 2011

(86) PCT No.: PCT/EP2011/071235
§ 371 (c)(1),
(2), (4) Date: Jun. 3, 2013

(87) PCT Pub. No.: WO2012/072608
PCT Pub. Date: Jun. 7, 2012

(65) Prior Publication Data
US 2013/0256112 A1    Oct. 3, 2013

(30) Foreign Application Priority Data
Dec. 3, 2010    (DE) .......................... 10 2010 053 342

(51) Int. Cl.
H03K 17/96    (2006.01)
H03K 17/965    (2006.01)

(52) U.S. Cl.
CPC ............ *H03K 17/962* (2013.01); *H03K 17/965* (2013.01)

(58) Field of Classification Search
CPC ................ H03K 17/96; H03K 17/975; H01H 2239/006; H01H 2003/0293; H01H 2217/032; H01H 3/12
USPC ......................................................... 200/600
See application file for complete search history.

(56) References Cited

U.S. PATENT DOCUMENTS

2008/0142353 A1* 6/2008 Jeitner .................. B60K 37/06
200/600

FOREIGN PATENT DOCUMENTS

DE    3109911    9/1982
EP    1635366    3/2006

OTHER PUBLICATIONS

International Search Report for corresponding patent application No. PCT/EP2011/071235 dated Jan. 9, 2012.

*Primary Examiner* — Renee Luebke
*Assistant Examiner* — Ahmed Saeed
(74) *Attorney, Agent, or Firm* — Renner, Otto, Boiselle & Sklar, LLP

(57) ABSTRACT

The control unit, in particular for a vehicle component, is provided with a manually actuable control element (12) for selecting and optionally for activating a control function, wherein the control element (12) can be moved manually into a selection and/or trigger position for selecting and optionally for activating a control function. In addition, the control unit has a capacitive tactile sensor (41) for identifying manual touching contact with the control element (12) and optionally identifying the event of a hand approaching the control element (12), wherein the tactile sensor (41) has a first and a second electrode (38, 40), which have electrode sides which substantially face one another and are spaced apart from one another. The first electrode (38) is arranged on the control element (12). The second electrode (40) is arranged immovably. The two electrodes (38, 40) extend with respect to one of the two dimensions thereof spanning the electrode sides parallel to the direction of the relative movement of the two electrodes (38, 40), said relative movement being performed as the control element (12) is moved manually into the selection and/or trigger position, wherein the size of the overlapping areas (34, 36) of the opposing electrode sides, which overlapping areas are provided during the relative movement of the two electrodes (38, 40), remains substantially the same.

6 Claims, 2 Drawing Sheets

CONTROL UNIT, IN PARTICULAR FOR A VEHICLE COMPONENT

Figure 1:
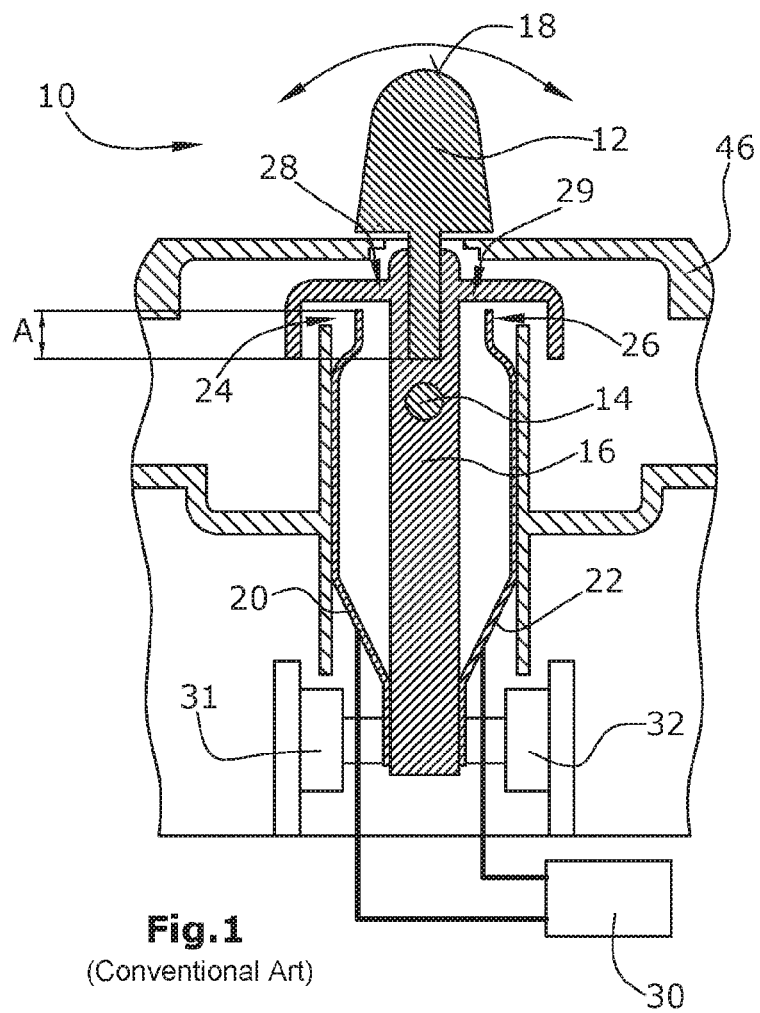

The invention relates to a control unit, in particular for a vehicle component such as a radio, a navigation device, an air-condition control device or an infotainment system, for instance.

In order to improve upon the operating comfort control units for vehicle components, for instance, it is known to provide manually actuable control elements with which it is possible to detect, e.g., the fingers of a hand approaching and touching the control unit. This can be used, for instance, to display information previously not displayed to a person actuating the control unit on a graphical user surface prior to the activation of the actual control instruction or the selection of a submenu item.

Examples of such concepts for the constructive design of a capacitive proximity sensor system, also known as capacitive run-up detection, are described in DE-A-10 2005 029 503, DE-A-10 2005 029 512, DE-A-10 2006 954 764 and WO-A-2007/014780. A joystick shift lever with a capacitive sensor system for detecting exclusively the movement of shift lever is described in DE-B-29 31 489.

The known control units of the above-mentioned type comprise at least one manually actuable control element for selecting and optionally also for activating a control function. Further, a capacitive tactile sensor is provided which has a first and a second electrode and is connected with an evaluation circuit (or, in general terms, an evaluation unit) via which a hand approaching the control element and/or the hand touching the control element is detected by a change in capacitance. In this context, the capacitance change signals of the tactile sensor resulting from a contact/approach have to be differentiated from noise or other interference signals. During contact with the control element, the actuation and in particular the movement of the same, e.g. by turning a control knob, shifting a slider and pressing buttons or pushbuttons or toggle (rocker) switches, cause capacitance changes in the tactile sensor, which can be misinterpreted by the evaluation unit if no partly complex circuitry-related countermeasures are taken.

It is an object of the invention to improve upon the detection of the contact with a control element of a control unit provided with a capacitive proximity sensor system.

For the purpose of achieving this object, the invention proposes a control unit, in particular for a vehicle component, provided with

- a manually actuable control element for selecting and optionally for activating a control function,
- wherein the control element can be moved manually into a selection and/or trigger position for selecting and optionally for activating a control function, and
- a capacitive tactile sensor for detecting a manual touching contact with the control element and optionally for detecting the approach of a hand to the control unit,
- wherein the tactile sensor comprises a first and a second electrode, which have electrode sides which substantially face each other and are spaced apart from each other.

According to the invention, it is provided in this control unit

- that the first electrode is arranged on the control element,
- that the second electrode is arranged immovably, and
- that the two electrodes extend with respect to one of the two dimensions thereof spanning the electrode sides parallel to the direction of the relative movement of the two electrodes, the relative movement being performed as the control element is moved manually to the selection and/or trigger position,
- wherein the size of the overlapping areas of the opposing electrode sides, existing during the relative movement of the two electrodes, remains substantially the same.

According to the invention, a capacitive proximity sensor system for a control unit of a (e.g., vehicle component) control unit is proposed, wherein a first electrode arranged in or on the control element, and thus movable with the control element, and a second electrode arranged in or on the control unit, and thus arranged stationarily, are positioned relative to each other such that the distance between them and the size of the surface areas responsible for the capacitive coupling of the two electrodes respectively remain substantially the same, the consecutive surface areas, when seen in projection, lying opposite each other or overlapping each other. Thus, the capacitance remains substantially unchanged when the control element is actuated and moved, so that the signal-to-noise ratio, by which the evaluation unit can differentiate a contact with or an approach to the control unit from an absence of a contact or an approach, remains substantially the same during the actuation of the control element.

According to a preferred embodiment of the invention it is provided that the electrode side of the first electrode has a dimension parallel to the direction of relative movement of the two electrodes that is smaller than the dimension of the electrode side of the second electrode parallel to the direction of relative movement, and that, during the relative movement of the two electrodes, the electrode side of the first electrode remains inside the electrode side of the second electrode, when seen in projection at right angles to the direction of relative movement. Thus, the movable first electrode always faces (another) surface area of the stationary second electrode throughout the movement of the control element from the "first" touch to the selection of the control function and—optionally—to the triggering of the control function by a corresponding further actuation of the control element, without the degree of the capacitive coupling of both electrodes ever changing.

The concept of the invention is applicable in particular in pushbuttons and toggle or rocker switches. When these keys are touched, their movement is restricted substantially to a pressing of the key for activating the or a control function by triggering a switching function by means of a switch adapted to be actuated when pressed. In case of a control element that is also rotatable or in case of a slidable control element, the concept of the invention further prevents the occurrence of a (substantial) change in capacitance in the proximity sensor system when the control element is turned or slid, for instance, to select a submenu item or an input on a graphical user interface or the magnitude of a setting parameter (e.g. prior to the actuation thereof). In the two latter examples, the control element is designed as a control knob or a slide element adapted to be moved manually from a present rotational or shift position to a selected position and to be moved on from there to the trigger position.

In another advantageous embodiment of the invention it can be provided that the control element has a contact surface for manual contact by a person, and that the contact surface is electrically conductive and is electrically connected with the first electrode.

Figure 2:
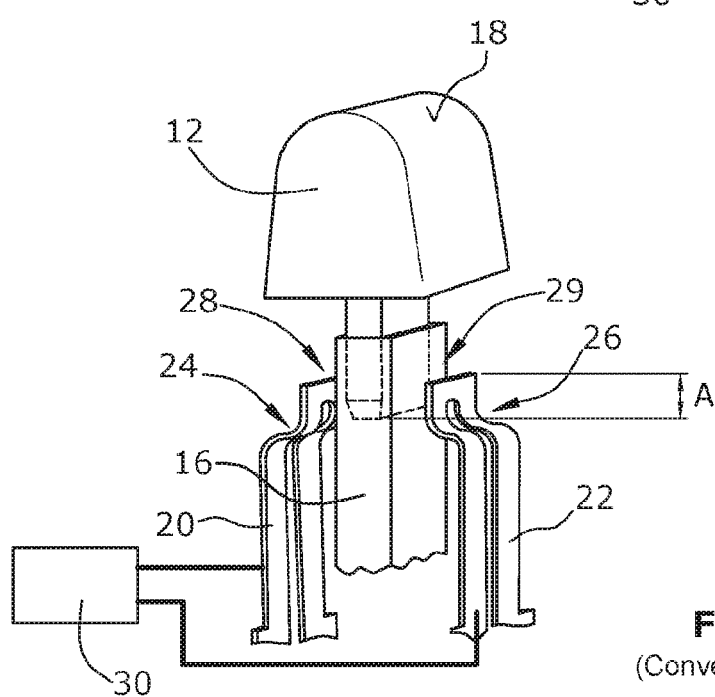
Figure 3:
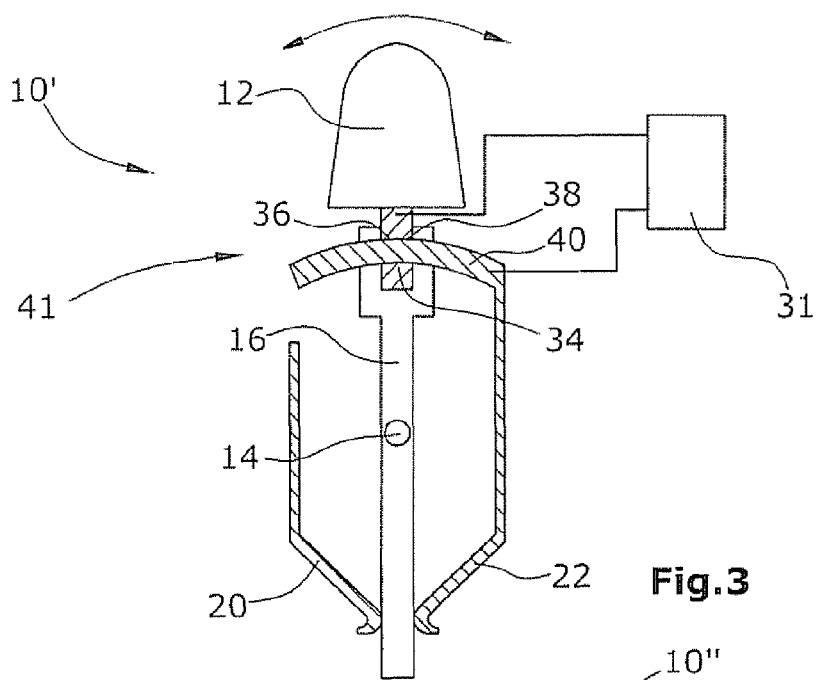
Figure 4:
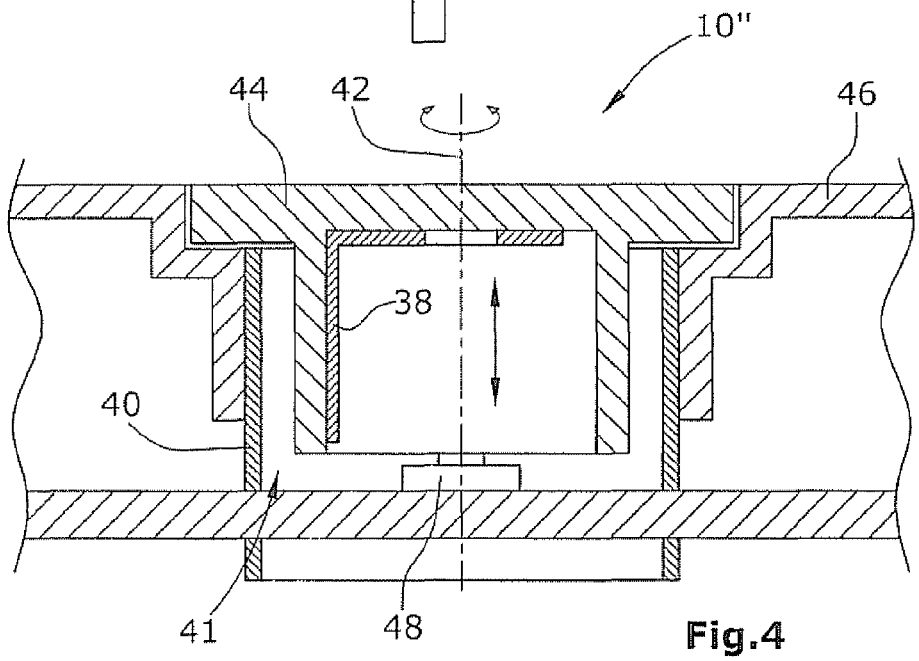
Figure 5:
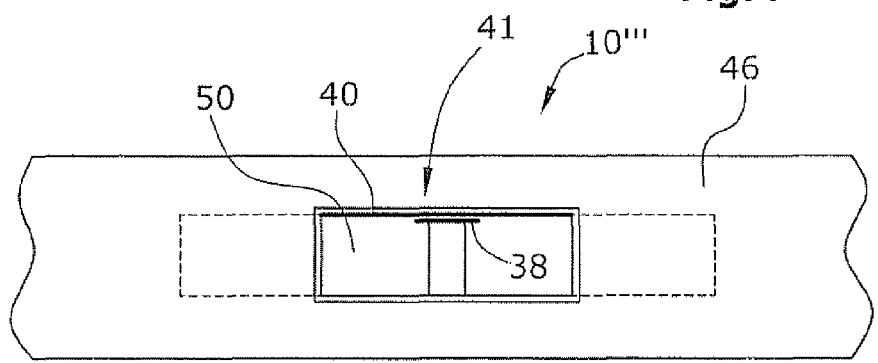

The invention will be described in detail hereinafter with reference to several embodiments and to the drawing. Specifically, the Figures show:

FIG. 1 a schematic illustration of the structure of a toggle switch with a capacitive proximity sensor system of a design different from the invention, FIG. 2 an illustration of a part of the proximity sensor system of the toggle switch in FIG. 1, FIG. 3 a schematic illustration of a constructive modification of the toggle switch in FIG. 1, the electrodes of the proximity sensor system being designed according to the invention, FIG. 4 a schematic illustration of another embodiment of the invention with a control knob as the control element, and FIG. 5 a schematic illustration of a final embodiment of the invention with a slidably movable control element.

Starting from FIGS. 1 and 2, it is explained hereunder which design of the electrodes results in an undesirable change in capacitance when a control unit is actuated; it can be derived from this, how the electrodes of the capacitance of a proximity sensor system of a toggle-switch control element should be configured so as to avoid being exposed to undesirable changes in capacitance when being actuated.

The toggle switch 10 comprises the actual control element 12 which is connected with a lever 16 supported for rotation at 14. The control element 12 has a surface 18 that is chrome-plated, for instance, and is thus conductive. The mechanical resetting of the lever 16 is ensured by the two lateral leaf springs 20, 22. These leaf springs 20, 22 have additional portions 24, 26 that are not mechanically resilient but can be used for a capacitive sensing of a contact with the control element. In the region of the overlap A, two capacitors 28, 29 are provided (also see FIG. 2) that form a proximity sensor and whose change in capacitance caused by contact is electronically evaluated in an evaluation unit 30, for instance. The switches for triggering the control functions (e.g., raising or lowering the blower or raising or lowering the set temperatures) are illustrated at 31, 32 and cooperate with the end of the lever 16.

In the first exemplary design, the distance between the control element surface and the sensor surface of the leaf spring was changed by the toggle movement of the switch. This is due to the radial arrangement of the sensor surfaces. This results in large signal variations in the capacitive sensor system.

A variation of the toggle switch 10 of FIG. 1, according to the present invention, is schematically illustrated in FIG. 3. Here, the above described functional principle of capacitive coupling between a metal control element surface and a metal sensor surface is adopted; however, surfaces 34, 36, which are axial with respect to the rotational axis 14 of the toggle switch 10', of two electrodes 38, 40 of a proximity sensor system 41 are used for coupling, wherein the distance of the surfaces is not changed upon toggling. Moreover, the respective opposite capacitive coupling surfaces of both electrodes 38, 40 remain substantially the same when the toggle switch 10' is actuated. The inventive structure of the proximity sensor system 41 not only offers the advantage that the distance between the capacitively coupled surfaces is constant; it is also possible to make that distance smaller, since no space for sensor surface movement has to be provided. This reduction in distance allows for significantly stronger sensor signals.

FIG. 4 (partly) illustrates a control unit 10" according to another embodiment of the invention, with a control knob and a proximity sensor system designed according to the invention. The control unit 10" of FIG. 4 has a control knob 44 adapted to be turned about the axis 42, which knob may be surrounded by a bezel or a cover 46 of the control unit. A first electrode 38 is arranged on the control knob 44 and is capacitively coupled with a stationary second electrode 40. Both electrodes suitably extend through 360° in the circumferential direction and are thus similar to a cylinder shell and are arranged coaxially with respect to each other. One of the two electrodes 38, 40 of the proximity sensor system 41 could also merely extend over a section in the circumferential direction. In both cases, when the control knob 44 is rotated, the distance of the two electrodes 38, 40 remains the same, as does the size of the opposite capacitively coupled surfaces of the electrodes 38, 40. This is also true, when, e.g. by confirming an input of a function or a predetermined parameter selected by a previous turning of the control knob 44, the control knob 44 is pressed to trigger a switch function by means of a switch 48, In FIG. 5, the present arrangement of the two electrodes 38, 40 of a proximity sensor system 41 is realized in a linearly slidable control element 50 of a further control unit 10'''. Again, it is true for the entire sliding path of the control element 50 that the distance of the electrodes 38, 40 and the size of their capacitively coupled surfaces remain the same, respectively.

List of Reference Numerals

10 toggle switch
10' alternative toggle switch
10" control unit
10''' control unit
12 control element
14 rotational axis
16 lever
18 contact surface
20 leaf spring
22 leaf spring
24 leaf spring region
26 leaf spring region
28 capacitor
29 capacitor
30 evaluation unit
31 switch
32 switch
34 surface of the first electrode
36 surface of the second electrode
38 first electrode
40 second electrode
41 proximity sensor system
42 axis
44 control knob (rotary control element)
46 cover
48 switch
50 slidable control element

The invention claimed is:

1. A control unit, comprising
   a manually actuable control element for selecting and optionally for activating a control function,
   wherein the control element can be moved manually from a non-selection and/or non-trigger position into a selection and/or trigger position for selecting and optionally for activating a control function, and
   a capacitive tactile sensor for detecting manual touching contact with the control element and optionally for detecting the event of a hand approaching the control element,
   wherein the tactile sensor has a first and a second electrode, which have electrode sides which substantially face one another and are spaced apart from one another, wherein
- the first electrode is arranged on the control element,
- the second electrode is arranged immovably, and
- the two electrodes extend with respect to one of two dimensions thereof spanning the electrode sides parallel to the direction of movement of the first electrode relative to the second electrode, said movement being performed as the control element is moved manually into the selection and/or trigger position,
- wherein a size of overlapping areas of opposing electrode sides, existing during the movement of the first electrode relative to the second electrode between the non-selection and/or non-trigger position to the selection and/or trigger position, remains substantially the same.

2. The control unit of claim 1, wherein the control element is a depressible key or a toggle switch adapted to be toggled in one or in two mutually opposite directions.

3. The control unit of claim 1, wherein the control element is designed as a control knob element or a slide element adapted to be moved manually from a currently assumed rotary or sliding position to a selection position and from there onward to the trigger position.

4. The control unit of claim 1, wherein the control element comprises a contact surface for manual contact by a person, and that the contact surface is electrically conductive and is electrically connected with the first electrode.

5. The control unit of claim 1, wherein the control element has a contact surface for manual contact by a person, and that the contact surface is coupled with the first electrode not conductively, but capacitively.

6. A control unit, comprising
- a manually actuable control element for selecting and optionally for activating a control function,
- wherein the control element can be moved manually for selecting and optionally for activating a control function, and
- a capacitive tactile sensor for detecting manual touching contact with the control element and optionally for detecting the event of a hand approaching the control element,
- wherein the tactile sensor has a first and a second electrode, which have electrode sides which substantially face one another and are spaced apart from one another, wherein
- the first electrode is arranged on the control element,
- the second electrode is arranged immovably, and
- the two electrodes extend with respect to one of two dimensions thereof spanning the electrode sides parallel to the direction of movement of the first electrode relative to the second electrode, said movement being performed as the control element is moved manually into the selection and/or trigger position,
- wherein a size of overlapping areas of opposing electrode sides, existing during the movement of the first electrode relative to the second electrode, remains substantially the same, wherein the electrode side of the first electrode has a dimension parallel to the direction of movement of the first electrode relative to the second electrode that is smaller than a dimension of the electrode side of the second electrode parallel to the direction of movement, and that, during the movement of the first electrode relative to the second electrode, the electrode side of the first electrode remains inside the electrode side of the second electrode, when seen in projection at right angles to the direction of relative movement.

* * * * *